(12) United States Patent
Sakamoto et al.

(10) Patent No.: US 6,555,850 B1
(45) Date of Patent: Apr. 29, 2003

(54) FIELD-EFFECT TRANSISTOR

(75) Inventors: Ryoji Sakamoto, Yokohama (JP); Shigeru Nakajima, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/505,700

(22) Filed: Feb. 17, 2000

(30) Foreign Application Priority Data

Feb. 19, 1999 (JP) .......................................... P11-040976

(51) Int. Cl.[7] ................ H01L 31/0328; H01L 31/0336; H01L 31/072; H01L 31/09
(52) U.S. Cl. ...................... 257/192; 257/183; 257/189; 257/190; 257/194; 257/200; 438/172; 438/174; 438/191; 438/194; 438/197; 438/285
(58) Field of Search ..................... 257/299, 190–195, 257/197, 183–89, 200; 438/285, 172–74, 187–97

(56) References Cited

U.S. PATENT DOCUMENTS

| | | | | |
|---|---|---|---|---|
| 4,987,462 A | * | 1/1991 | Kim et al. ..................... | 357/22 |
| 5,077,875 A | * | 1/1992 | Hoke et al. ................. | 29/25.01 |
| 5,116,773 A | * | 5/1992 | Park et al. ..................... | 437/41 |
| 5,148,245 A | * | 9/1992 | Takikawa et al. .............. | 357/22 |
| 5,206,527 A | * | 4/1993 | Kuwata ........................ | 257/191 |
| 5,286,662 A | * | 2/1994 | Kuwata ........................ | 437/40 |

(List continued on next page.)

FOREIGN PATENT DOCUMENTS

| | | | | |
|---|---|---|---|---|
| EP | 0 555 886 A2 | 8/1993 | | |
| EP | 0 757 392 A1 | 2/1997 | | |
| EP | 0 803 912 A1 | 10/1997 | | |
| JP | 62-208621 | 12/1987 | | |
| JP | 4-326735 | * | 4/1991 | ......... H01L/21/338 |
| JP | 0510705 a2 | * | 4/1992 | ......... H01L/29/804 |
| JP | 4-326734 | * | 11/1992 | ......... H01L/21/338 |
| JP | 06-084959 | | 3/1994 | |
| JP | 6-236898 | * | 8/1994 | ......... H01L/21/338 |
| JP | 09-102600 | | 4/1997 | |
| JP | 10-261653 | | 9/1998 | |

OTHER PUBLICATIONS

Feb. 27, 2002 Office Action corresponding to JP Patent Appln. No. 10–2000–0008082.

Jan. 18, 2000 Office Action corresponding to Korean Patent Appln. No. 040976/1999.

Patent Abstracts of Japan, Pub. No. 04139836, dated May 13, 1992 of Japanese Appln. No. 02263432.

Patent Abstracts of Japan, Pub. No. 09260643, dated Oct. 3, 1997 of Japanese Appln. No. 08070644.

(List continued on next page.)

*Primary Examiner*—Matthew Smith
*Assistant Examiner*—Granvill D Lee, Jr.
(74) *Attorney, Agent, or Firm*—Smith, Gambrell & Russell, LLP

(57) ABSTRACT

A field-effect transistor has a composite channel structure having a first channel layer containing GaInP semiconductor and a second channel layer containing GaAs semiconductor. When the electric field is low in the channel, a channel current is primarily conducted in the second channel layer. When the electric field is high, the electrons flowing in the second channel layer move through real space transition to the first channel layer. These electrons conduct in the channel primarily in the first channel layer. Since GaInP semiconductor has a wider forbidden bandwidth than that of GaAs semiconductor, the avalanche breakdown voltage of GaInP semiconductor is higher than that of GaAs semiconductor. When the electric field is high, the conduction electrons travel in this GaInP semiconductor layer. This also improves the avalanche breakdown voltage of the field-effect transistor.

9 Claims, 6 Drawing Sheets

U.S. PATENT DOCUMENTS

| | | | | |
|---|---|---|---|---|
| 5,331,185 A | * | 7/1994 | Kuwata | 257/192 |
| 5,331,410 A | * | 7/1994 | Kuwata | 257/192 |
| 5,436,470 A | | 7/1995 | Nakajima | |
| 5,446,296 A | | 8/1995 | Nakajima | |
| 5,453,631 A | | 9/1995 | Onda et al. | |
| 5,479,427 A | * | 12/1995 | Yoshida et al. | 372/45 |
| 5,508,530 A | | 4/1996 | Nakajima | |
| 5,734,671 A | * | 3/1998 | Katsuyama et al. | 372/46 |
| 5,838,030 A | * | 11/1998 | Liu et al. | 257/2 |
| 6,037,615 A | * | 3/2000 | Matsuyama et al. | 257/192 |
| 6,100,542 A | * | 8/2000 | Kohara et al. | 257/20 |
| 6,144,049 A | * | 11/2000 | Onda | 257/194 |
| 6,177,685 B1 | * | 1/2001 | Teraguchi et al. | 257/20 |
| 6,207,976 B1 | * | 3/2001 | Takahashi et al. | 257/192 |
| 6,232,624 B1 | * | 5/2001 | Matloubian et al. | 257/194 |
| 6,262,444 B1 | * | 7/2001 | Hori et al. | 257/192 |
| 6,307,221 B1 | * | 10/2001 | Danzilio | 257/192 |
| 6,316,820 B1 | * | 11/2001 | Schmitz et al. | 257/649 |
| 6,326,650 B1 | * | 12/2001 | Allam | 257/186 |
| 6,483,135 B1 | * | 11/2002 | Mizuta et al. | 257/283 |

OTHER PUBLICATIONS

Patent Abstracts of Japan, Pub. No. 09246526, dated Sep. 19, 1997 of Japanese Appln. No. 08051165.

S.F. Yoon, et al., "Fabrication and characteristics of $In_{0.48}Ga_{0.52}P/In_{0.20}Ga_{0.80}As/GaAs$ pseudomorphic high electron mobility transistor grown by solid–source molecular beam epitaxy," Microelectronics Journal, vol. 30, 1999, pp. 23–28.

W.E. Hoke, et al., "AlGaAs/InGaAs/AlGaAs double pulse doped pseudomorphic high electron mobility transistor structures on InGaAs substrates," J. Appl. Phys., vol. 82, No. 7, Oct. 1, 1997, pp. 3576–3580.

Copy of International Search Report, dated Jun. 13, 2000, for counterpart application EP 00 10 3538.

Naoki Hara, et al., "Low–Distortion GaAs–Based Field Effect Transistors with InGaP Channel Layer for High–Voltage Operation," IEDM 98, 1998, pp. 63–66.

* cited by examiner

FIELD-EFFECT TRANSISTOR

BACKGROUND OF THE INVENTION

1. Field of the Invention

The present invention relates to a III–V compound semiconductor field-effect transistor.

2. Related Background Art

In semiconductor device art, field-effect transistors made of III–V compound semiconductor materials such as GaAs and InP are known. Since GaAs and InP have smaller electron effective masses than that of silicon (Si), they have high electron mobility. These materials are suitable for high-frequency devices.

Available high-frequency devices include voltage-controlled elements such as a field-effect transistor (FET) having an active layer of GaAs semiconductor and a high-electron-mobility transistor (HEMT), and current-controlled elements such as a hetero-bipolar transistor (HBT).

SUMMARY OF THE INVENTION

The inventors have found the following problem in the course of studying high-frequency devices.

FIG. 1 shows the dependence of the electron drift velocities on electric field strength in GaAs, InP, and Si semiconductors. The slopes of characteristic curves shown in FIG. 1 indicate the electron mobility of these materials. GaAs and InP have mobility three to five times as large as that of Si.

GaAs and InP, however, indicate the characteristics as follows. As the field strength increases, their electron drift velocities rise to the respective maximum values and decrease. When the electric field strength further increases, the carriers lose the kinetic energy by optical phonon scattering. Due to this scattering, the electron drift velocity approaches a certain value, e.g., approximately $1.0 \times 10^7$ cm/s, which is independent of the electric field strength. The advantage of the higher mobility in such materials is lost in the following two cases: (i) the GaAs and InP devices operate under a high applied voltage; and (ii) the device dimensions are reduced, so that the internal electric field increases.

In GaAs, the avalanche breakdown phenomenon occurs at relatively low voltage. The avalanche breakdown voltage relates to the internal electric field in semiconductor, and the voltage is inversely proportional to the impurity concentration. If the impurity concentration of a GaAs active layer is about $1.0 \times 10^{18}$ cm$^{-3}$, only an avalanche breakdown voltage of about 30 V can be achieved in commercially available devices. The inventors have found the following problem: when device dimensions decrease, not only the electron velocity but also the breakdown voltage of the device lowers under device operation.

On the other hand, InP is a material having smaller electron mobility than that of GaAs, but its maximum electron drift velocity is higher than that of GaAs semiconductor. InP semiconductor FETs also has been developed. InP semiconductor can not attain Schottky barrier height enough to be applied to MESFET, and also can not be applied to MIS FET or MOS FET because no semiconductor material and insulating film suitable for these FET are not found.

To avoid this problem, an attempt has been made to apply semiconductor having a composition of $Ga_{0.51}In_{0.49}P$ to an active layer. In this semiconductor, a number of In cites in an InP semiconductor crystal are replaced with Ga atoms. This $Ga_{0.51}In_{0.49}P$ has the following characteristics: (a) an energy gap value of 1.9 eV; (b) an electron effective mass larger than that of GaAs semiconductor. Avalanche breakdown voltages depend upon the energy gap values of semiconductors. Under the same impurity concentration, the larger the energy gap is, the higher the avalanche breakdown voltage becomes. A $Ga_{0.51}In_{0.49}P$ semiconductor FET has an avalanche breakdown voltage of 50 V or more. With this semiconductor, the device can achieve a high avalanche breakdown voltage. $Ga_{0.51}In_{0.49}P$ semiconductor, however, has smaller mobility than that of GaAs semiconductor because of its effective mass. The inventors have found that, under high electric field, GaInP semiconductor attains electron drift velocity nearly equal to that of GaAs. Therefore, in the high-frequency performance, the $Ga_{0.51}In_{0.49}P$ device is about as high as a GaAs semiconductor device.

It is an object of the present invention to provide a device having a high avalanche breakdown voltage and high performance in high-frequency regions.

A field-effect transistor according to the present invention includes a channel layer and a gate electrode. The channel layer has a first $Ga_xIn_{1-x}As_yP_{1-y}$ layer ($0<x<1$, $0 \leq y<1$) and a $Ga_zIn_{1-z}As$ layer ($0<z\leq 1$). The gate electrode is provided so as to control a channel current flowing in the channel layer.

Since the channel layer includes the first $Ga_xIn_{1-x}As_yP_{1-y}$ layer and the $Ga_zIn_{1-z}As$ layer, this $Ga_zIn_{1-z}As$ layer serves as a main channel when the applied voltage is low. As the applied voltage is increased, carriers begin moving to the Γ-valley energy level of the first $Ga_xIn_{1-x}As_yP_{1-y}$ layer, not to the L-valley energy level of the GaInAs layer. When the applied voltage is high, the first $Ga_xIn_{1-x}As_yP_{1-y}$ layer serves as a main channel.

Additionally, the first $Ga_xIn_{1-x}As_yP_{1-y}$ layer has a larger energy gap than that of the $Ga_zIn_{1-z}As$ layer. When the applied voltage is high, the carriers conduct in the first $Ga_xIn_{1-x}As_yP_{1-y}$ layer having a relatively large avalanche breakdown voltage.

In the present invention, any features in accordance with the present invention as described below can be arbitrarily combined with each other.

The field-effect transistor according to the present invention can further include a first $Al_uGa_{1-u}As$ layer ($0 \leq u<1$). The first $Al_uGa_{1-u}As$ layer ($0 \leq u<1$) can be provided between a substrate and the channel layer.

The field-effect transistor according to the present invention can further include a second $Al_vGa_{1-v}As$ layer ($0 \leq v<1$). The second $Al_vGa_{1-v}As$ layer ($0 \leq v<1$) can be provided between the gate electrode and the channel layer. This can increase the barrier height against the gate electrode.

In the field-effect transistor according to the present invention, the first $Ga_xIn_{1-x}As_yP_{1-y}$ layer can contain donor impurities. The $Ga_zIn_{1-z}As$ layer has smaller donor impurity concentration than that of said first $Ga_xIn_{1-x}As_yP_{1-y}$ layer.

In the field-effect transistor according to the present invention, the first $Ga_xIn_{1-x}As_yP_{1-y}$ layer can be in contact with the $Ga_zIn_{1-z}As$ layer ($0<z\leq 1$). The first $Ga_xIn_{1-x}As_yP_{1-y}$ layer can also have a lattice constant different from that of GaAs semiconductor. This is the case where the $Ga_zIn_{1-z}As$ layer preferably has a thickness equal to or smaller than the critical thickness.

In the field-effect transistor according to the present invention, the first $Ga_xIn_{1-x}As_yP_{1-y}$ layer can have substantially the same lattice constant as a GaAs layer.

In the field-effect transistor according to the present invention, the channel layer can further have a second $Ga_pIn_{1-p}As_qP_{1-q}$ layer (0<p<1, 0≦q<1). The $Ga_zIn_{1-z}As$ layer (0<z≦1) can be provided between the first $Ga_xIn_{1-x}As_yP_{1-y}$ layer and the second $Ga_pIn_{1-p}As_qP_{1-q}$ layer.

In the field-effect transistor according to the present invention, the second $Ga_pIn_{1-p}As_qP_{1-q}$ layer can have substantially the same lattice constant as GaAs semiconductor.

In the field-effect transistor according to the present invention, the channel layer can include a $Ga_tIn_{1-t}P$ layer (0<t<1) and a GaAs layer.

In the field-effect transistor according to the present invention, the substrate can be a GaAs substrate. The first $Ga_xIn_{1-x}As_yP_{1-y}$ layer can also have substantially the same lattice constant as GaAs semiconductor.

The present invention will become more fully understood from the detailed description given hereinbelow and the accompanying drawings, which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
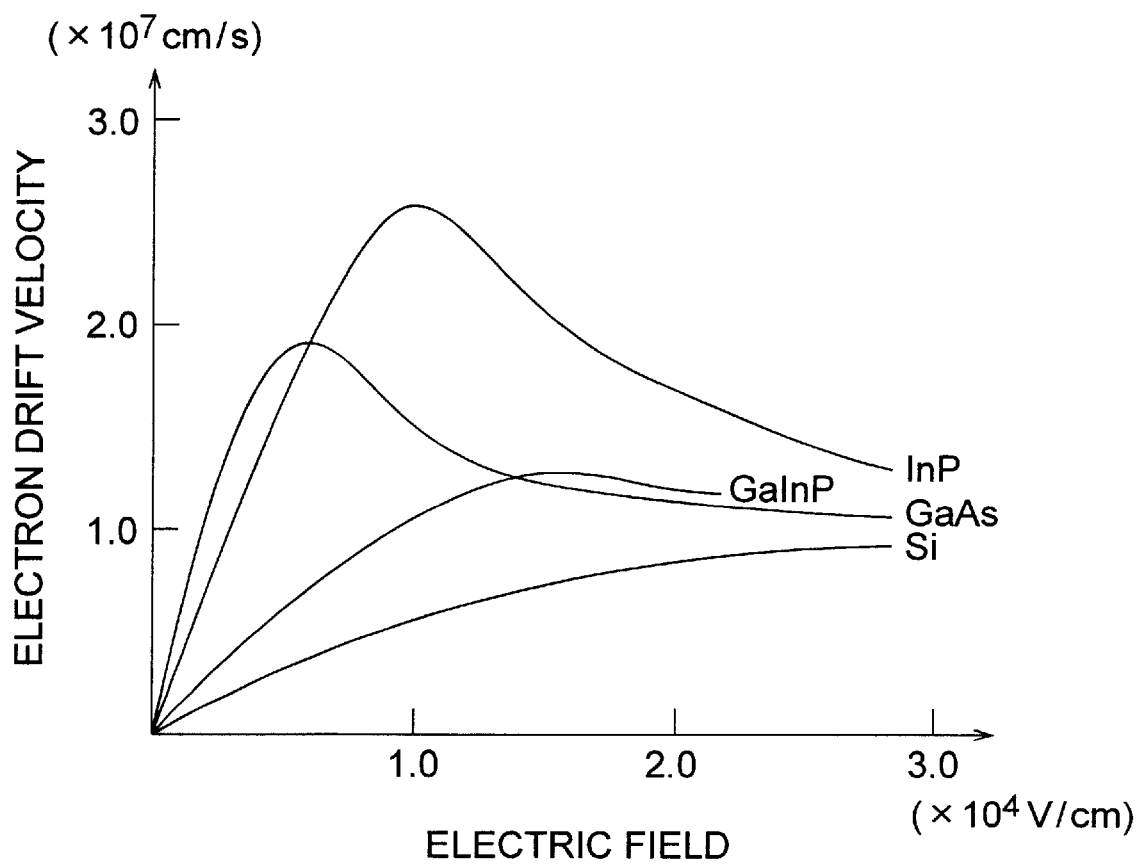
FIG. 1 is a graph showing the relationships between the electron drift velocities of various semiconductor materials and the electric field strength.

The present invention can be readily understood by taking into account the following detailed description with reference to the accompanying drawings. Preferred embodiments of a field-effect transistor according to the present invention will be described in detail below with reference to the accompanying drawings. In these drawings, the same reference numerals denote the same parts, and a duplicate description thereof will be omitted.

Figure 2A:
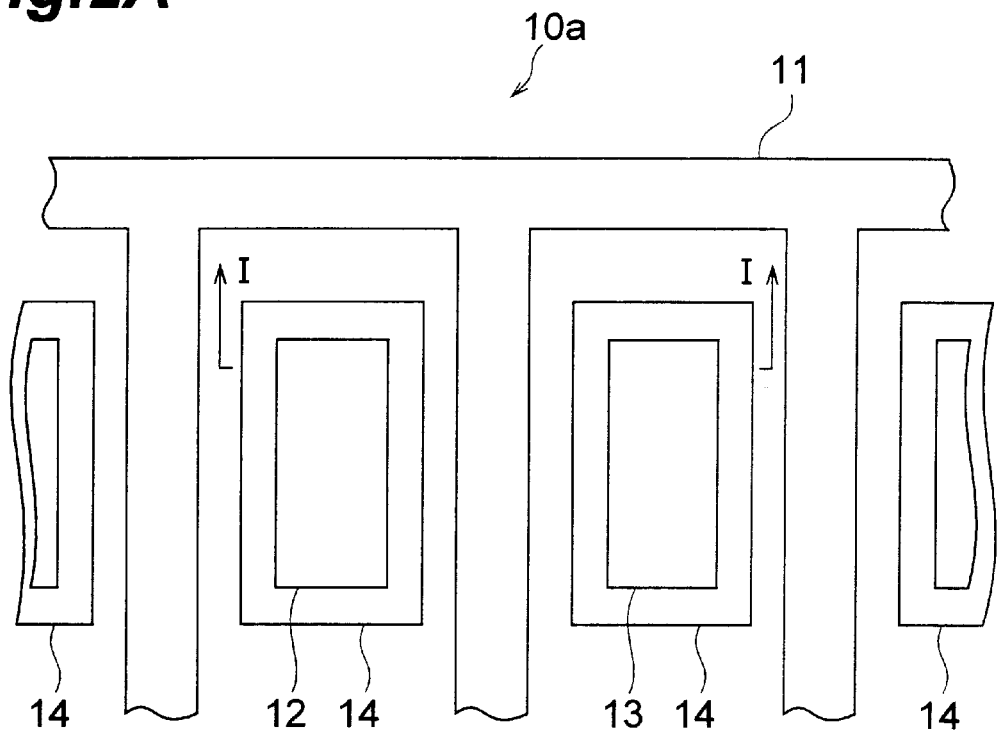
FIG. 2A is a plan view showing a FET of an embodiment.
Figure 2B:
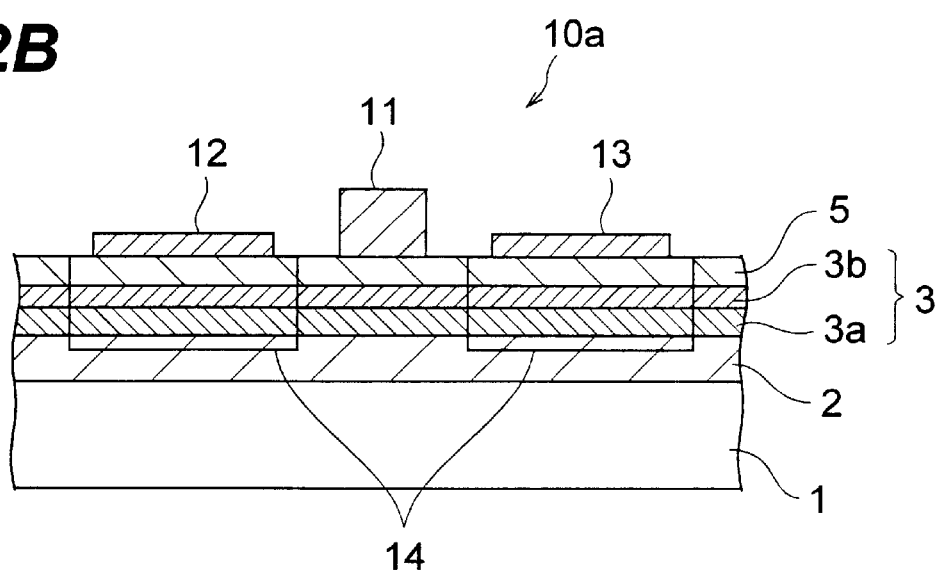
FIG. 2B is a sectional view taken along the line I—I in the FET of the embodiment.

FIGS. 2A and 2B show a field-effect transistor 10a according to an embodiment of the present invention. The field-effect transistor 10a includes a substrate 1, a first $Al_uGa_{1-u}As$ layer (0≦u<1) 2, a channel layer 3, a second $Al_yGa_{1-y}As$ layer (0≦v<1) 5, and a gate electrode 11. The channel layer 3 has a first $Ga_xIn_{1-x}As_yP_{1-y}$ layer (0<x<1, 0≦y<1) 3a and a $Ga_zIn_{1-z}As$ layer (0<z≦1) 3b. The gate electrode 11 is so disposed as to control a channel current flowing in the channel layer 3. The second $Al_yGa_{1-y}As$ layer 5 can be disposed between the gate electrode 1 and the channel layer 3b. The first $Al_uGa_{1-u}As$ layer 2 can be formed between the substrate 1 and the channel layer 3.

In this field-effect transistor 10a, typical materials, film thickness, and carrier concentrations of the individual layers formed on the substrate 1 are listed below:

| | Material name | Film thickness | Carrier concentration |
|---|---|---|---|
| Substrate 1 | Semi-insulating GaAs substrate | | |
| Layer 2 | Undoped AlGaAs layer | 500 nm | $1.0 \times 10^{15}$ cm$^{-3}$ |
| Layer 3a | n-type GaInP layer | 30 nm | $2.0 \times 10^{18}$ cm$^{-3}$ |
| Layer 3b | n-type GaAs layer | 20 nm | $1. \times 10^{17}$ cm$^{-3}$ |
| Layer 5 | Undoped GaAs layer | 30 nm | $5.0 \times 10^{15}$ cm$^{-3}$ |

These semiconductor layers 2, 3a, 3b, and 5 are sequentially formed on the substrate 1 by, for example, Organometallic Vapor Phase Epitaxy (OMVPE) or Molecular Beam Epitaxy (MBE).

For example, a GaAs substrate can be used as the substrate 1. The GaAs substrate can be an undoped substrate. In the GaAs substrate, the substitution of As atoms to Ga sites produces deep donor levels as referred to EL2. These levels are compensated for by conduction electrons. This compensation makes the GaAs substrate semi-insulating. A doped substrate can also be used as well as an undoped substrate. The doped substrate contains impurities such as chromium (Cr) atoms and oxygen (O) atoms, which generate trap levels. In the doped substrate, these levels trap conduction electrons. This trapping makes the substrate semi-insulating. The doped substrate has less influence of EL2 levels upon its performance, which occurs by electrons detrapped in a long lifetime from the EL2 in undoped substrates. The EL2 also has influence on device performance such as low-frequency characteristics, drift characteristics, and leakage current characteristics.

The AlGaAs semiconductor layer 2 serves as a buffer layer. This buffer layer functions as an interlayer for preventing crystal defects in the GaAs substrate from being reflected on subsequent deposited layers. This AlGaAs semiconductor layer 2 also serves as a potential barrier layer for the n-type GaInP layer 3a formed thereon. Thus, the buffer layer preferably has a larger energy gap than that of the channel layer formed thereon and preferably has an electron barrier ΔEc with respect to the channel layer. This allows the buffer layer to serve as a barrier against electrons conducting in the channel. The buffer layer preferably also has substantially the same lattice constant as GaAs semiconductor crystal used for the substrate. Consequently, high-quality crystals can be obtained. AlGaAs semiconductor is substantially lattice-matched with GaAs semiconductor in almost all range of Al and Ga composition. Since no impurity is intentionally doped in the buffer layer, an n-i junction is formed between the AlGaAs layer 2 and the GaInP channel layer 3a. In the junction of these materials, the value of the potential barrier is approximately 1.0 eV, which is substantially a half of the AlGaAs semiconductor energy gap.

The composition of Al is preferably about 0.3. If the composition is smaller than this value, the energy difference ΔEc between the conduction bands of the buffer layer and the channel layer decreases. This decreases causes channel carriers leakage into the buffer layer. If the composition is much larger than the value above, it is difficult to grow a crystal.

The GaInP layer 3a functions as a first channel, and the GaAS layer 3b functions as a second channel. The GaInP layer 3a can be doped with n-type impurities. The GaAs layer 3b can be undoped. This GaAs layer 3b can also be doped with a smaller amount of n-type impurities than that of the impurities in the GaInP layer 3a.

The GaInP layer 3a is in contact with the GaAs layer 3b. In this GaInP layer 3a, the band bends toward the substrate 2 from the interface with the GaAs layer 3b. This bend generates depletion in the layer. Electrons in the GaInP layer 3a primarily travel in that region of this GaInP layer 3a, which extends along the AlGaAs layer. This region functions as a channel.

In the GaAs layer 3b, an electron accumulation region is formed. The region extends along the interface with the GaInP layer 3a. Electrons in this region are primarily supplied from donor impurities in the GaInP layer 3a. The GaAs layer 3b has a low impurity concentration (or is undoped) compared to the GaInP layer 3a. This results in the small probability of scattering electrons traveling in the accumulated region by the impurities. Since there is little change of the electron mobility in this layer due to impurity scattering, the deterioration in the high-frequency performance of the field-effect transistor is suppressed.

For the second channel, GaInAs semiconductor can be used. Since GaInAs semiconductor is not lattice-matched with GaAs semiconductor, GaInAs semiconductor must have a thickness equal to or smaller than the critical thickness. Since GaInAs semiconductor has electron mobility and maximum electron drift velocity higher than those of GaAs semiconductor, the high-frequency characteristic of the device can, therefore, be further improved. The critical thickness indicates the maximum thickness of a layer which can be grown without lattice defects such as dislocation when the lattice constant of the underlying layer is different from that of the layer to be grown thereon. According to the findings of the inventors, as for $Ga_{0.85}In_{0.15}As$, the critical thickness is about 15 nm and tends to increase as the composition of In reduces.

The GaAs layer 5 functions as a cap layer. This cap layer can increase the barrier height at the interface with the metal used as the gate electrode 11, i.e., the metal-semiconductor interface. The GaAs layer 5 is undoped. In addition to a GaAs semiconductor, AlGaAs semiconductor is also applied for the cap layer. In the case of GaAs semiconductor, no layer containing Al element appears on the device surface, no attention is required to be paid to the oxidation of Al in the semiconductor. When an undoped GaAs semiconductor is used for the second channel, this cap layer can be omitted. This is the case where the gate electrode 11 is directly formed on the GaAs layer 2.

It is preferable to apply, to the gate electrode 11, a metal attaining the higher barrier height of the metal-semiconductor junction with the cap layer. The gate electrode material must also be chosen in respect of adhesion to the cap layer and the long-term reliability of the junction. The gate materials include, for example, refractory metals such as W and Ta in addition to Ti, Pt, and Al. The gate electrode can also have a multilayered metal film in which a layer of chemically inert metal with low electrical resistance, e.g., gold, is formed on a Schottky metal layer which forms a metal-semiconductor junction.

Ohmic electrodes 12 and 13 are formed so as to sandwich the gate electrode 11 therebetween. These ohmic electrodes 12 and 13 contain material which can obtain a good ohmic contact with an n-type semiconductor. In this embodiment, the ohmic electrodes 12 and 13 are formed by depositing an AuGe/Ni multilayered metal film on the semiconductor layer and alloying.

Below the ohmic electrodes 12 and 13, n-type regions 14 having a high carrier concentration are formed. These n-type regions 14 are formed by selectively implanting Si ions into semiconductor layers and annealing the layers. The n-type regions 14 are so formed as to reach the GaInP semiconductor layer. Consequently, the ohmic electrodes 12 and 13 are connected to the first and second channels.

Figure 3A:
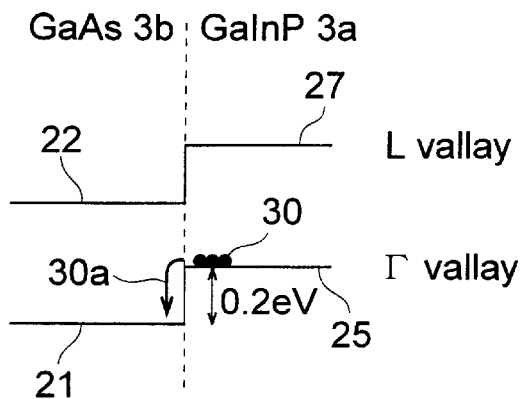
FIG. 3A is a view showing the respective energy band structures of conduction bands in GaAs and GaInP semiconductors.

FIG. 3A schematically shows an energy band diagram in which a junction between GaInP semiconductor layer 3a and the GaAs semiconductor layer 3b are not made. This diagram represents the energy levels of a bottom (Γ-valley) 21 and a bottom (L-valley) 23 of the conduction band in the GaAs semiconductor layer 3b and the energy levels of a bottom (Γ-valley) 25 and a bottom (L-valley) 27 of the conduction band in the GaInP semiconductor 3a. In the case of $Ga_{0.5}In_{0.5}P$, the bottom (Γ-valley) 25 of the conduction band in the GaInP semiconductor 3a has energy about 0.2 eV higher than that of the bottom (Γ-valley) 21 of the conduction band in the GaAs semiconductor 3b.

Figure 3B:
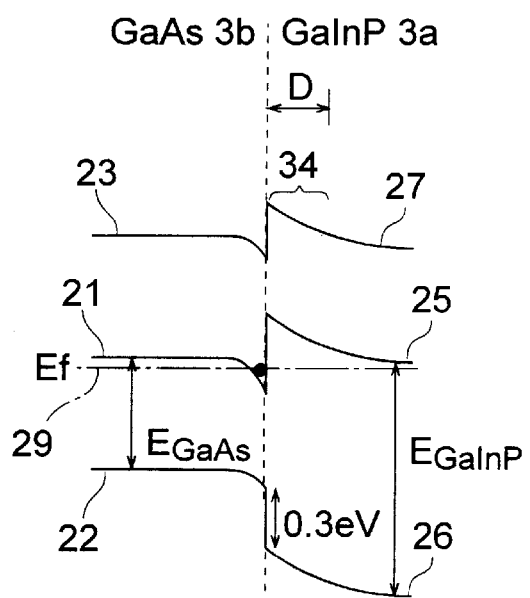
FIGS. 3B and 3C are views showing the energy band structures of conduction bands in the heterojunction of GaAs semiconductor and GaInP semiconductor.

FIG. 3B schematically shows an energy diagram when a junction between these two semiconductor layers 3a and 3b are made. In FIG. 3B, the Fermi level Ef is indicated by the reference numeral 29. FIG. 3B also shows a valence band 26 of the GaInP semiconductor layer 3a and a valence band 27 of the GaAs semiconductor layer 3b. When the two semiconductor layers 3a and 3b are joined, Electrons (30 in FIG. 3A) in the GaInP semiconductor layer 3a having the high-energy conduction band 25 move to the conduction band 21 of the GaAs semiconductor layer 3b. This movement (30a in FIG. 3A) attains potential balance at the interface between the two semiconductor layers 3a and 3b and also forms a two-dimensional electron accumulation region 32, in the GaAs semiconductor layer 3b, in which conduction electrons are accumulated along the junction with the GaInP semiconductor layer 3a. Meanwhile, in the GaInP semiconductor layer 3a, a region 34 having a width D from the junction with the GaAs semiconductor layer 3b is depleted. In FIG. 3B, the bent bands on both sides of the junction indicate the accumulated layer 32 and the depletion layer 34, respectively.

Figure 3C:
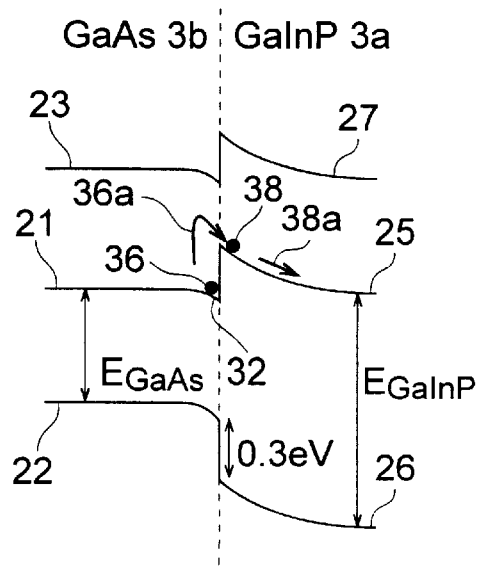

The transition of electrons in the channel will be described below with reference to FIG. 3C. When a voltage is applied between the source and drain, carriers 36 in the channel layer is accelerated by an electric field generated by this applied voltage. When this applied voltage is small, the channel current primarily flows in the accumulated region 32 in the GaAs semiconductor 3b. When the applied voltage is increased, the electrons 36 in the accumulated layer 32 receive a large amount of energy from the electric field. When the conduction electron 36 has a predetermined amount of kinetic energy to some extent, the electrons 36 can transit to the next energy level. In the GaAs semiconductor layer 3b, the next energy level is the L-valley energy level 23, and the effective mass of an electron at this L-valley level 23 is larger than the effective mass of an electron at the Γ-valley level 21. However, the GaInP semiconductor layer 3a contacting with the GaAs semiconductor layer 3b has the Γ-valley level 25 lower than the L-valley level 23. Accordingly, the conduction electrons 36 in the accumulated region 32 are excited to the Γ-valley level 25 of the GaInP semiconductor layer 3a, not to the L-valley level 23 of the GaAs semiconductor layer 3b. This excitation 36a indicates electron transition in real space.

The electrons 36 at the Γ-valley level 21 and the electrons 38 at the Γ-valley level 25 each has a smaller effective mass than that of the L valley electron. In other words, the effective mass in the Γ-valley 25 of GaInP semiconductor is smaller than the effective mass in the L-valley of GaAs semiconductor. This difference between these effective masses prevents the large reduction in the electron mobility when conduction electrons move from the GaAs semiconductor layer 3b to the GaInP semiconductor layer 3a. As a consequence, the deterioration of the performance of this field-effect transistor 10a is suppressed in a high-frequency region as compared to a transistor in which a channel layer is made of a single GaAs semiconductor layer. Furthermore, GaInP semiconductor, employed in the FET of FIG. 2, is superior to GaAs semiconductor in that this GaInP semiconductor has a greater electron mobility than that of GaAs semiconductor.

In the real space transition, the electrons 36 in the GaAs semiconductor 3b can make transition only in a region of the layer 3a which extends along the GaAs semiconductor layer 3b. In this GaInP semiconductor layer 3a, the conduction band is bent such that the potential lowers in the direction away from the surface of the junction with the GaAs semiconductor layer 3b. This band bend enables the electrons 38 that have transited in the real space to drift (38a) into the GaInP semiconductor layer 3a.

Conduction electrons conduct in different semiconductor layers before and after the real space transition; they travel in the GaAs semiconductor layer (ΔEGaAs=1.4 eV) 3b before the transition and in the GaInP semiconductor layer (ΔEGaInP=1.9 eV) 3a after the transition, respectively.

Figure 4:
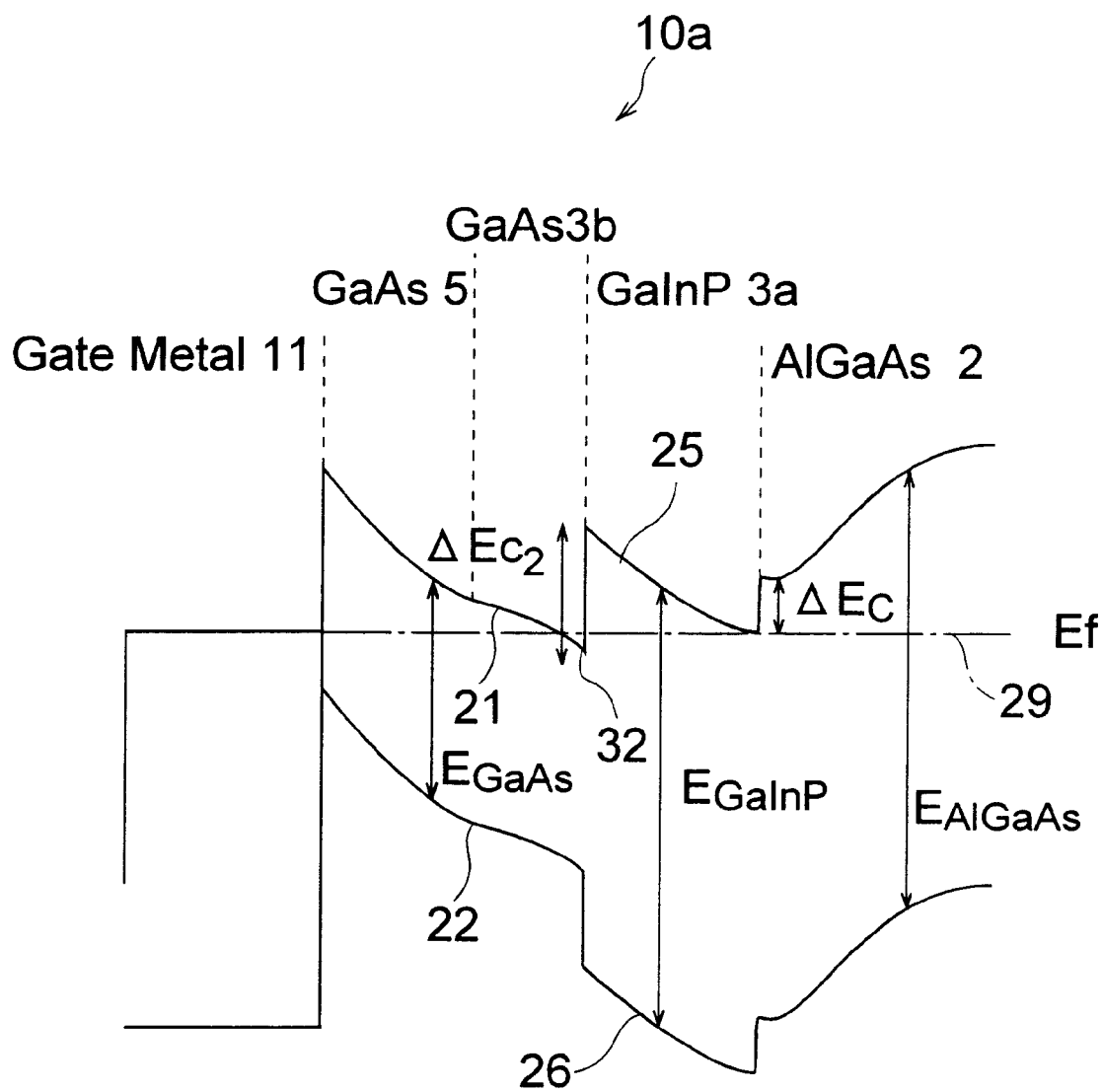
FIG. 4 is a view showing the energy band in the FET of the embodiment.

The operation of the field-effect transistor 10a shown in FIGS. 3A to 3C will be described below with reference to a potential diagram in FIG. 4. In this field-effect transistor 10a, one of the ohmic electrodes 12 and 13 is the source, and the other is the drain. While a predetermined gate bias is applied between the gate and source, the drain bias applied between the drain and source is gradually increased. When this drain bias is small, electrons can travel in both the first and second channel layers 3a and 3b. Since a GaAs semiconductor has higher electron mobility, the channel electrons are primarily conducted in the GaAs semiconductor layer 3b, i.e., in the second channel (linear operation). The conduction in this second channel is also dominant because the channel is closer to the gate electrode.

When the drain bias is increased, a reverse bias is applied between the gate and drain. With this reverse bias applied, a depletion region extends from the gate electrode and reaches the second channel. When the drain bias is further increased, the depletion region gradually extends into the second channel to completely deplete the channel in the vicinity of the drain. Since the bias attracting electrons is still applied to the drain, the electrons from the source travel in the channel and reach the drain through the depleted region (saturation operation). During the conduction, the electrons are accelerated by the voltage applied between the source and drain. Energy obtained by the acceleration enables the electrons to transit to a higher energy level. Since the electrons are conducted in the GaAs semiconductor layer, they are supposed to transit to the excitation level of the GaAs semiconductor. It should be noted that this GaAs semiconductor has a junction with the GaInP semiconductor. The lowest energy level of the joined GaInP semiconductor is lower than the excitation level of the GaAs semiconductor. Therefore, the accelerated electrons make transition to the lowest energy level of the GaInP semiconductor, i.e., to the bottom of the conduction band thereof. There is a depletion region near the boundary with the GaAs semiconductor layer, and the lowest energy level of the GaInP semiconductor bends in this region. The electrons that have transited to the conduction band of the GaInP semiconductor are accelerated by this band bend in a direction in which the potential lowers, i.e., in the direction away from the GaAs semiconductor layer. Consequently, the electrons move to the drain through the first channel between the depletion layer and the AlGaAs layer (ΔEAlGaAs=1.8 eV, ΔEc1=0.1 eV). The transited electrons are conducted in a region between the AlGaAs layer and the depletion layer and contributes to the current flowing between the source and drain.

In the FET shown in FIG. 2, the channel layer can include the repetition of GaInP layers and GaAs layers.

Figure 5:
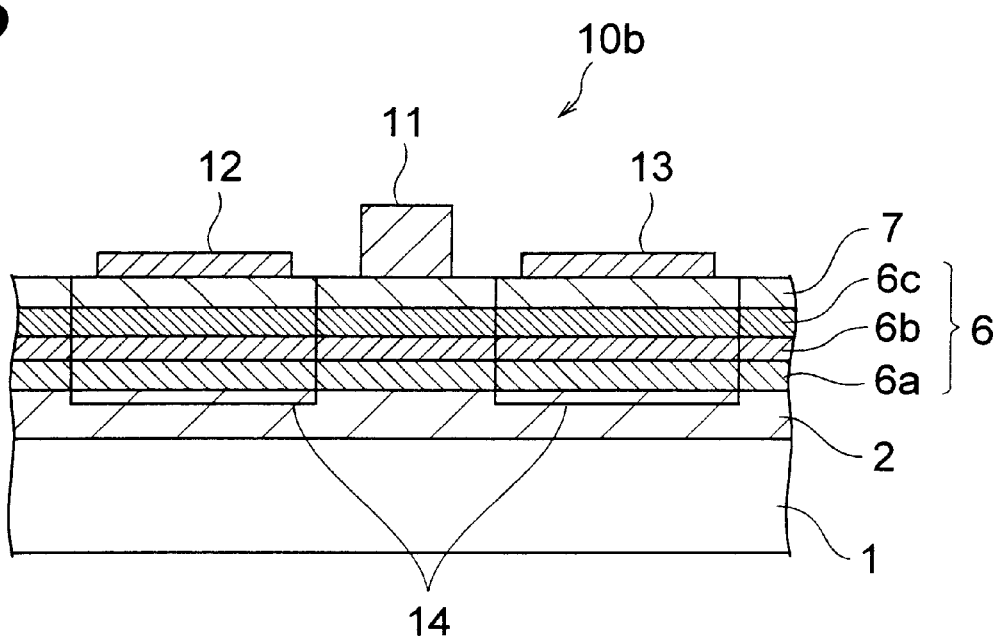
FIG. 5 is a sectional view showing a FET according to another embodiment.

FIG. 5 shows a field-effect transistor 10b according to another embodiment of the present invention. This field-effect transistor 10b includes a substrate 1, a first $Al_uGa_{1-u}As$ layer ($0 \leq u < 1$) 2, a channel layer 6, a second $Al_vGa_{1-v}As$ layer ($0 < v < 1$) 7, and a gate electrode 11. The channel layer 6 has a first $Ga_xIn_{1-x}As_yP_{1-y}$ layer ($0<x<1, 0 \leq y<1$) 6a, a $Ga_zIn_{1-z}As$ layer ($0<z \leq 1$) 6b, and a third $Ga_rIn_{1-r}As_sP_{1-s}$ layer ($0<r<1, 0 \leq s<1$) 6c. The $Ga_zIn_{1-z}As$ layer ($0<z \leq 1$) 6b is formed between the first $Ga_xIn_{1-x}As_yP_{1-y}$ layer 6a and the third $Ga_rIn_{1-r}As_sP_{1-s}$ layer 6c. The gate electrode 11 is so formed as to control the channel current flowing in the channel layer 6. The field-effect transistor 10b in FIG. 5 uses the AlGaAs layer 7, instead of the GaAs layer 5 as in the field-effect transistor 10a of FIG. 2B.

Typical materials, film thickness, and carrier concentrations of the individual layers formed on the substrate 1 in this field-effect transistor 10b are listed below:

|  | Material name | Film thickness | Carrier concentration |
|---|---|---|---|
| Substrate 1 | Semi-insulating GaAs substrate |  |  |
| Layer 2 | Undoped AlGaAs layer | 500 nm | $1.0 \times 10^{15}$ cm$^{-3}$ |
| Layer 6a | n-type GaInAsP layer | 70 nm | $3.0 \times 10^{17}$ cm$^{-3}$ |
| Layer 6b | n-type GaInAs layer | 10 nm | $1.0 \times 10^{17}$ cm$^{-3}$ |
| Layer 6c | n-type GaInAsP layer | 70 nm | $3.0 \times 10^{17}$ cm$^{-3}$ |
| Layer 7 | Undoped AlGaAs layer | 30 nm | $5.0 \times 10^{15}$ cm$^{-3}$ |

In this embodiment, the $Ga_xIn_{1-x}As_yP_{1-y}$ layer ($0<x \leq 1, 0 \leq y<1$) 6a and the third $Ga_rIn_{1-r}As_tP_{1-t}$ layer ($0<r \leq 1, 0 \leq t<1$) 6c are in contact with the two sides of the GaAs layer 6b. This achieves potential balance at both interfaces between the GaAs layer 6b and the semiconductor layers 6a and 6c. Consequently, a third channel is formed between the second channel layer 6b and the gate electrode 11.

To increase the mobility of two-dimensional electrons, the GaInAs layer 6b preferably has low carrier concentration. Also, to further utilize conduction in the GaInAsP layer, the GaInAsP layer is preferably doped with desired donor impurities to such an extent that no significant depletion layer is formed, even if potential balance is attained by the movement of electrons from the GaInAsP layer to the GaInAs layer to produce a finite ΔEc2.

Figure 6:
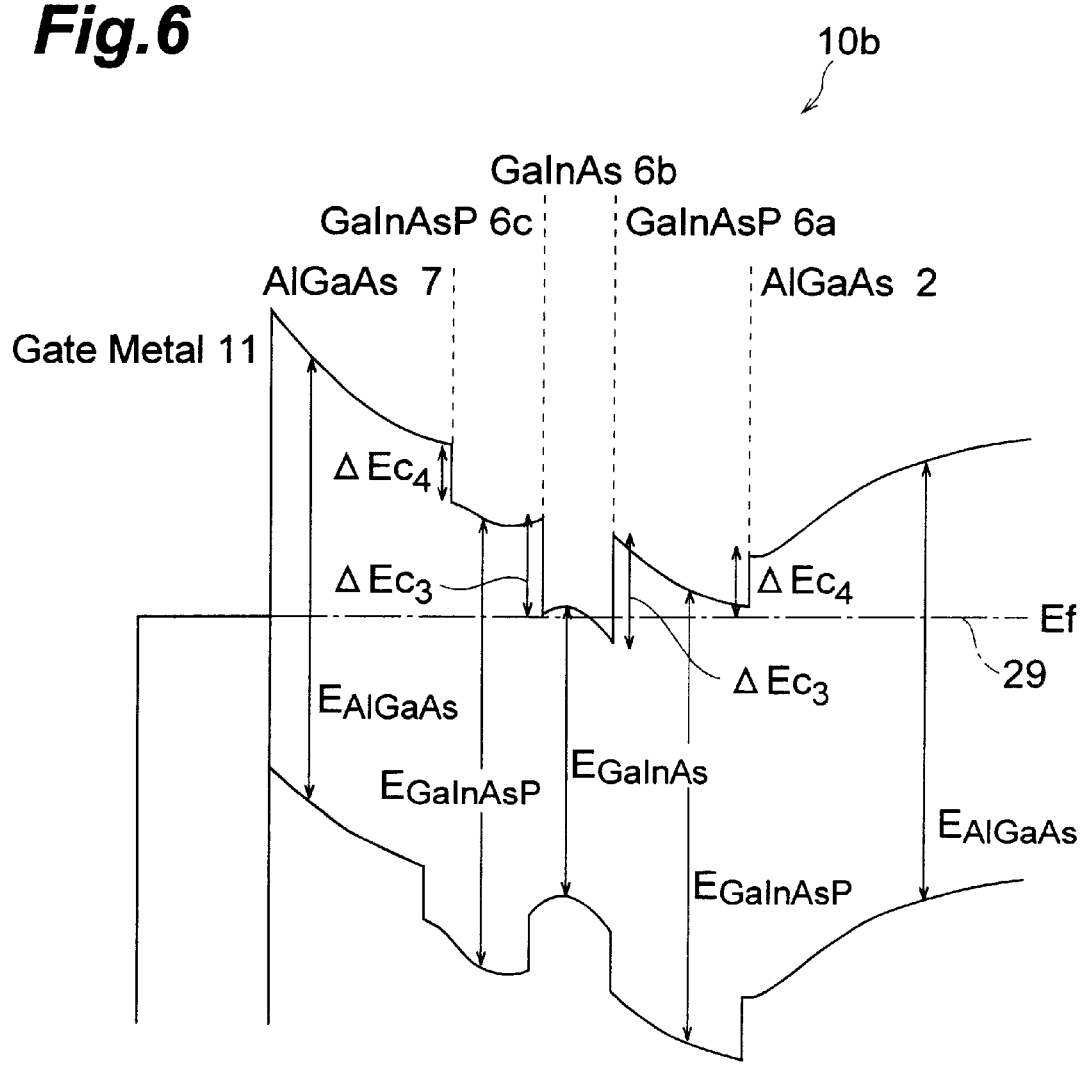
FIG. 6 is a view showing the energy band in the FET of the embodiment shown in FIG. 5.

With reference to FIG. 6, the operation of the transistor 10b in this embodiment will be described below. In the transistor 10b, the second channel layer 6b primarily contributes to conduction of electrons at low bias as in the first embodiment. In this embodiment, increasing the applied voltage makes real space transition feasible in the two GaInAsP layers 6a and 6c sandwiching the GaInAs semiconductor layer 6b. Therefore, even in a high electric field the transistor 10b provides a further improved saturation characteristic and breakdown voltage characteristic. Referring to FIG. 6, when $Al_{0.3}Ga_{0.7}As$, $Ga_{0.5}In_{0.5}As$, GaAs, $Ga_{0.5}In_{0.5}As$, and $Al_{0.3}Ga_{0.7}As$ are formed on the substrate, for example, ΔEc3=0.2 eV, ΔEc4=0.1 eV, ΔEGaInAsP 1.9 eV, and ΔEGaInAs=1.4 eV where ΔEGaInAsP becomes greater with increasing P content and ΔEGaInAs becomes smaller with increasing In content.

In the FET shown in FIG. 5, the channel layers 6a and 6c, in which electrons having high energy can transit regardless of whether a positive or negative gate voltage is applied to the source, are adjacent to the semiconductor layer 6b.

Although the present invention has been explained by presenting various embodiments, the present invention is not limited to these embodiments. For the first channel, a $Ga_xIn_{1-x}As_yP_{1-y}$ layer (0<x<1, 0≦y<1) can be used in place of the GaInP layer. This $Ga_xIn_{1-x}As_yP_{1-y}$ layer serves as the first channel, as in the case of the GaInP layer, in the following cases: this $Ga_xIn_{1-x}As_yP_{1-y}$ layer is lattice-matched with a GaAs semiconductor; and although it is not lattice-matched, the $Ga_xIn_{1-x}As_yP_{1-y}$ layer has a thickness equal to or smaller than the critical thickness. In a $Ga_xIn_{1-x}As_yP_{1-y}$ semiconductor, the forbidden bandwidth increases as the As doping amount reduces. So, the avalanche breakdown voltage is expected to be improved. Since the electron mobility increases as the amount of As dopant increases, the high-frequency performance of the FET is also expected to be improved.

According to the findings of the inventors, a $Ga_xIn_{1-x}As_yP_{1-y}$ semiconductor is lattice-matched with GaAs semiconductor when y=0 and x=0.51. "Lattice matching" means that the difference between the lattice constants of two joined semiconductor crystals is 0.1% or less. In the range of 0≦y<0.2, $Ga_xIn_{1-x}As_yP_{1-y}$ semiconductor can be applied to the first channel within the range of the critical thickness. For example, a critical thickness of about 15 nm is obtained when y=0.05.

An $Al_zIn_{1-z}Ga_tP_{1-t}$ layer (0<z≦1, 0<t<1) can be applied to the first channel.layer. In this $Al_zIn_{1-z}Ga_tP_{1-t}$ layer, the forbidden band gap becomes wider with increasing Al content. Thus, the breakdown voltage of this semiconductor is expected to be enhanced. The semiconductor has a critical thickness of 10 nm at Z=0.05.

In the field-effect transistors disclosed in this specification, at low bias, the electrons flowing in the second channel largely contribute to the current flow, and at high bias the electrons flowing in the first channel and/or the third channel largely contribute to current flow.

Accordingly, even in high bias condition, a high electron drift velocity can be held, so the deterioration of the high-frequency characteristic is suppressed for the FET. Additionally, in high bias condition, the current flows in the channel layer having a large band gap. This suppresses the lowering of the avalanche breakdown voltage in the field-effect transistor.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A field-effect transistor comprising:

a substrate made of GaAs;

a channel layer having a first $Ga_xIn_{1-x}As_yP_{1-y}$ (0<x<1, 0<y<1) layer and a GaAs layer, and a gate electrode formed so as to control a channel current conducting in said channel layer, wherein said first $Ga_xIn_{1-x}As_yP_{1-y}$ layer is substantially lattice-matched with GaAs of said substrate, wherein said first $Ga_xIn_{1-x}As_yP_{1-y}$ layer includes donor impurities, and said GaAs layer includes smaller donor impurity concentration than that of said first $Ga_xIn_{1-x}As_yP_{1-y}$ layer.

2. A field-effect transistor according to claim 1, further comprising:

a first $Al_uGa_{1-u}As$ layer (0≦u<1) provided between said substrate and said channel layer.

3. A field-effect transistor according to claim 1, further comprising a second $Al_vGa_{1-v}As$ layer (0≦v<1) provided between said gate electrode and said channel layer.

4. A filed-effect transistor according to claim 1, wherein said channel layer comprises a $Ga_tIn_{1-t}P$ layer (0<t<1) and a GaAs layer.

5. A field-effect transistor comprising:

a substrate made of GaAs;

a channel layer having a first $Ga_xIn_{1-x}As_yP_{1-y}$ (0<x<1, 0<y<1) layer and a GaAs layer, and a gate electrode formed so as to control a channel current conducting in said channel layer, wherein said first $Ga_xIn_{1-x}As_yP_{1-y}$ layer is substantially lattice-matched with GaAs of said substrate, wherein said channel layer further comprises a second $Ga_pIn_{1-p}As_qP_{1-q}$ layer (0<p<1, 0<q<1), and said GaAs layer is provided between said first $Ga_xIn_{1-x}As_yP_{1-y}$ and said second $Ga_pIn_{1-p}As_qP_{1-q}$ layer.

6. A field-effect transistor according to claim 5, wherein said second $Ga_pIn_{1-p}As_qP_{1-q}$ layer is substantially lattice-matched with GaAs of said substrate.

7. A field-effect transistor according to claim 5, further comprising:

a first $Al_uGa_{1-u}As$ layer (0≦u<1) provided between said substrate and said channel layer.

8. A field-effect transistor according to claim 5, further comprising a second $Al_vGa_{1-v}As$ layer (0≦v<1) provided between said gate electrode and said channel layer.

9. A filed-effect transistor according to claim 5, wherein said channel layer comprises a $Ga_tIn_{1-t}P$ layer (0<t<1) and a GaAs layer.

* * * * *